United States Patent
Tanaka

(10) Patent No.: US 11,145,493 B2
(45) Date of Patent: Oct. 12, 2021

(54) PLASMA ETCHING APPARATUS AND PLASMA ETCHING METHOD

(71) Applicant: Tokyo Electron Limited, Tokyo (JP)

(72) Inventor: Satoshi Tanaka, Icheon-si (KR)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/832,227

(22) Filed: Mar. 27, 2020

(65) Prior Publication Data

US 2020/0312622 A1 Oct. 1, 2020

(30) Foreign Application Priority Data

Mar. 28, 2019 (JP) .............................. JP2019-063648

(51) Int. Cl.
| | |
|---|---|
| *H01J 37/32* | (2006.01) |
| *H01J 37/16* | (2006.01) |
| *H01L 21/3065* | (2006.01) |
| *H05H 1/46* | (2006.01) |
| *H01L 21/02* | (2006.01) |
| *H01J 37/248* | (2006.01) |

(52) U.S. Cl.
CPC .......... *H01J 37/3244* (2013.01); *H01J 37/16* (2013.01); *H01J 37/248* (2013.01); *H01L 21/02164* (2013.01); *H01L 21/3065* (2013.01); *H05H 1/46* (2013.01); *H01J 37/32165* (2013.01)

(58) Field of Classification Search
CPC .... H01J 37/16; H01J 37/248; H01J 37/32146; H01J 37/32165; H01J 37/3244; H01L 21/02164; H01L 21/3065; H01L 21/31116; H05H 1/46

USPC ............ 156/345.15, 345.45, 345.47, 345.48; 216/67; 438/714

See application file for complete search history.

(56) References Cited

U.S. PATENT DOCUMENTS

| | | | |
|---|---|---|---|
| 8,974,684 B2* | 3/2015 | Banna ............... | H01L 21/31116 216/67 |
| 10,090,162 B2* | 10/2018 | Tanaka ............... | H01J 37/32706 |
| 2008/0110859 A1* | 5/2008 | Koshiishi .......... | H01L 21/76834 216/67 |
| 2017/0040176 A1* | 2/2017 | Long .................. | H01J 37/321 |

FOREIGN PATENT DOCUMENTS

JP 2000-311890 A 11/2000

* cited by examiner

*Primary Examiner* — Lan Vinh
(74) *Attorney, Agent, or Firm* — Pearne & Gordon LLP

(57) ABSTRACT

A plasma etching apparatus includes a processing vessel, a stage, a gas supply, a first high frequency power supply, a second high frequency power supply and a control device. The stage is provided and configured to place thereon a substrate. The gas supply is configured to supply a processing gas. The first high frequency power supply is configured to supply a first high frequency power. The second high frequency power supply is configured to supply a second high frequency power to the stage. The control device controls a supply and a stop of the supply of each of the first and the second high frequency powers at every preset cycle. The first and the second high frequency powers are supplied exclusively. A ratio of a supply time with respect to a single cycle of the first high frequency power is lower than that of the second high frequency power.

14 Claims, 11 Drawing Sheets

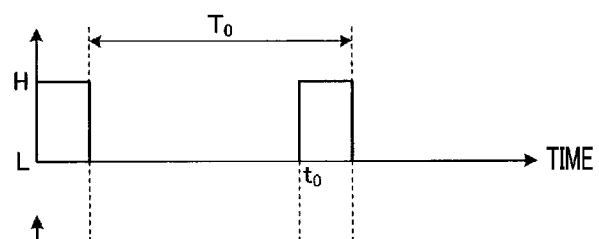
FIG. 2A HF
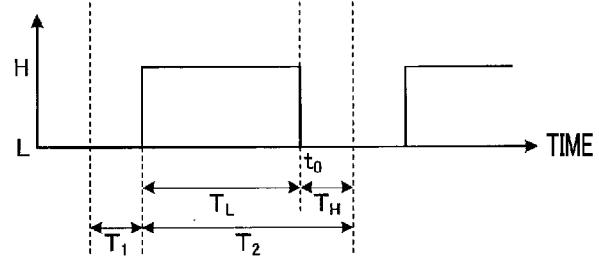
FIG. 2B LF
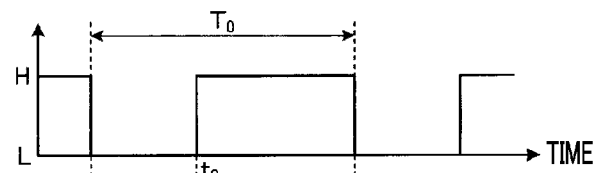
FIG. 3A HF
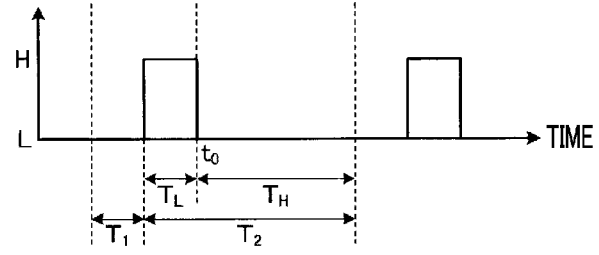
FIG. 3B LF

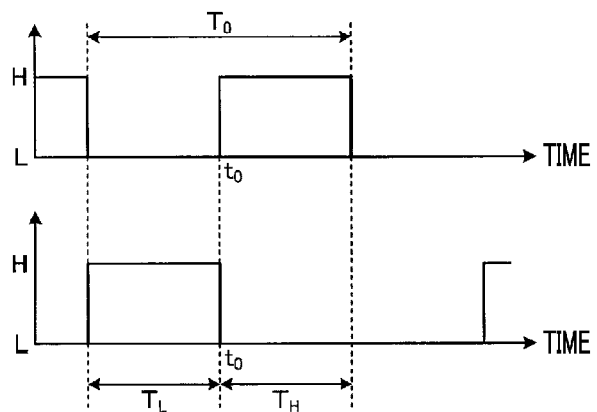
FIG. 4A HF
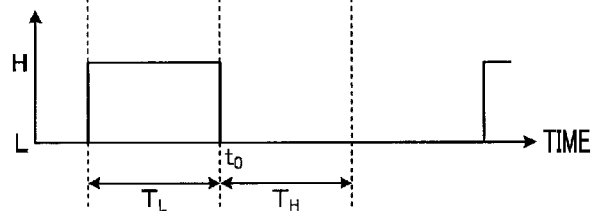
FIG. 4B LF
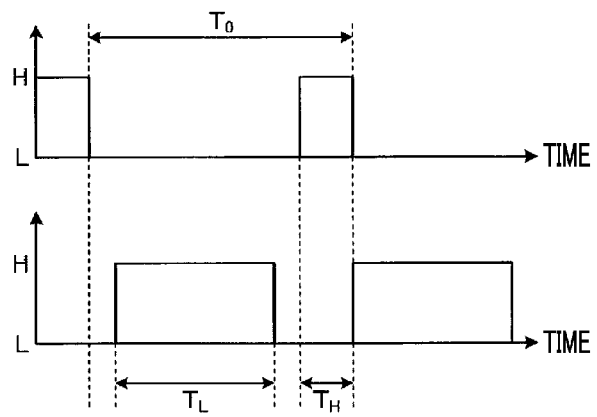
FIG. 5A HF
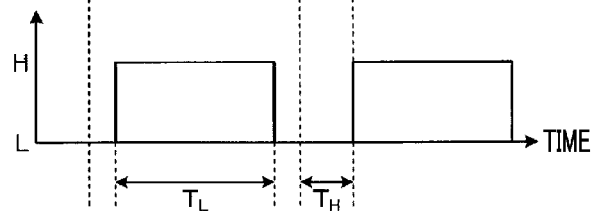
FIG. 5B LF

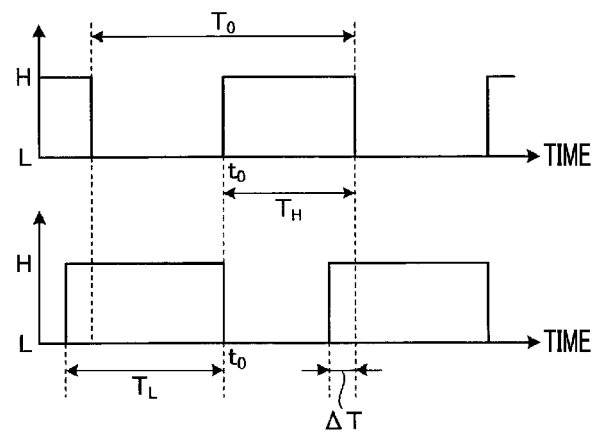
FIG. 6A HF
FIG. 6B LF

FIG. 8
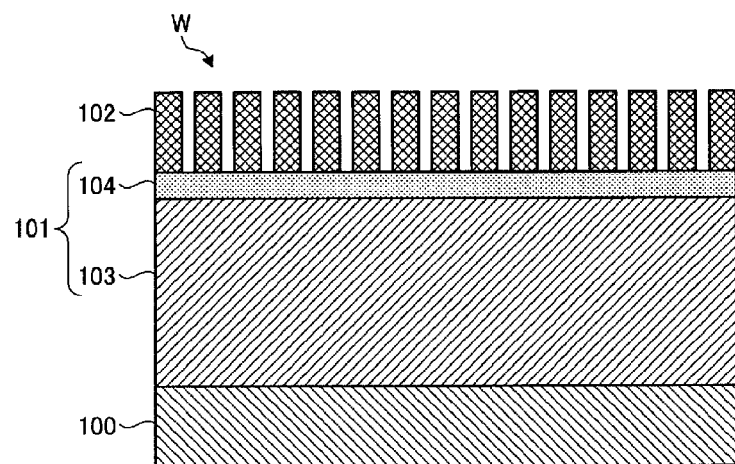
FIG. 9A  HF
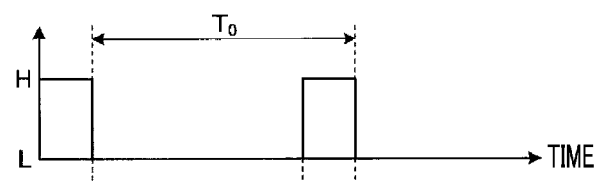
FIG. 9B  LF
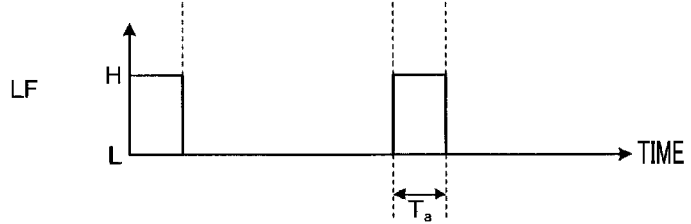

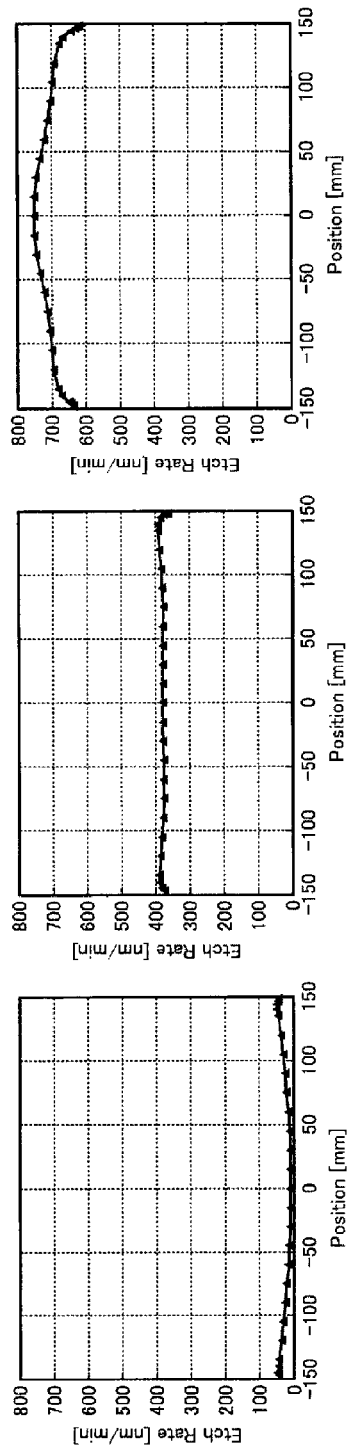

PLASMA ETCHING APPARATUS AND PLASMA ETCHING METHOD

CROSS-REFERENCE TO RELATED APPLICATION

This application claims the benefit of Japanese Patent Application No. 2019-063648 filed on Mar. 28, 2019, the entire disclosure of which is incorporated herein by reference.

TECHNICAL FIELD

The various aspects and embodiments described herein pertain generally to a plasma etching apparatus and a plasma etching method.

BACKGROUND

Patent Document 1, for example, describes a technique of delaying a phase of a pulse high frequency bias power with respect to a pulse high frequency source power by turning on/off the high frequency source power and the high frequency bias power periodically. Through this technique, a charge-up damage in dry etching can be suppressed.

Patent Document 1: Japanese Patent Laid-open Publication No. 2000-311890

SUMMARY

In an exemplary embodiment, a plasma etching apparatus includes a processing vessel, a stage, a gas supply, a first high frequency power supply, a second high frequency power supply and a control device. The stage is provided within the processing vessel and configured to place thereon a substrate on which a film as an etching target is formed. The gas supply is configured to supply a processing gas into the processing vessel. The first high frequency power supply is configured to supply a first high frequency power into the processing vessel to form a processing gas supplied into the processing vessel into plasma. The second high frequency power supply is configured to supply a second high frequency power having a frequency lower than a frequency of the first high frequency power to the stage. The control device is configured to control a supply and a stop of the supply of the first high frequency power and a supply and a stop of the supply of the second high frequency power. The control device controls the supply and the stop of the supply of each of the first high frequency power and the second high frequency power at every preset cycle. The first high frequency power and the second high frequency power are supplied exclusively. A ratio of a supply time with respect to a single cycle of the supply and the stop of the supply of the first high frequency power is lower than a ratio of a supply time with respect to the single cycle of the supply and the stop of the supply of the second high frequency power.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A and FIG. 2B are diagrams illustrating an example of pulse signals in the exemplary embodiment;

FIG. 3A and FIG. 3B are diagrams illustrating another example of the pulse signals;

FIG. 4A and FIG. 4B are diagrams illustrating yet another example of the pulse signals;

FIG. 5A and FIG. 5B are diagrams illustrating still yet another example of the pulse signals;

FIG. 6A and FIG. 6B are diagrams illustrating still yet another example of the pulse signals;

FIG. 8 is a cross sectional view illustrating an example of a wafer;

FIG. 9A and FIG. 9B are diagrams illustrating pulse signals used in a comparative experiment;

FIG. 12A to FIG. 12C are diagrams illustrating examples of an etching rate when a magnitude of a first high frequency power is varied;

DETAILED DESCRIPTION

Figure 1:
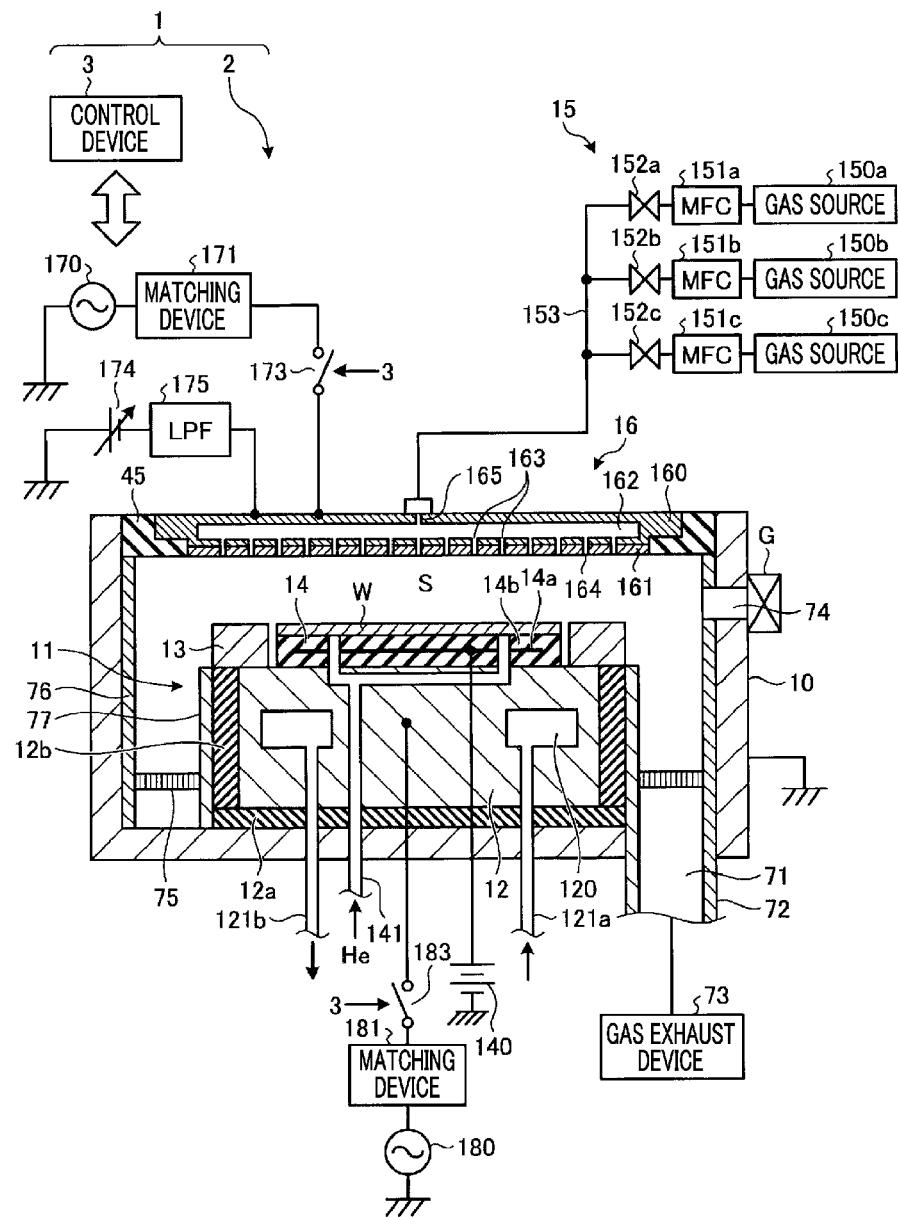
FIG. 1 is a schematic cross sectional view illustrating an example of a plasma etching apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a plasma etching apparatus and a plasma etching method of the present disclosure will be described in detail with reference to the accompanying drawings. However, it should be noted that the plasma etching apparatus and the plasma etching method of the present disclosure are not limited to the exemplary embodiments.

With a recent progress of miniaturization and high densification of a semiconductor device, a distance between adjacent holes formed in a substrate is narrowed. Further, if a structure such as a capacitor is formed within the semiconductor device, an aspect ratio of the structure needs to be set to be large to secure a volume of the structure to a certain extent. To form the structure having the large aspect ratio, a hole having a large aspect ratio needs to be formed.

When forming a hole by dry etching, so-called bowing occurs, whereby a width of a sidewall of the hole is increased with respect to a width of a bottom of the hole. With an increase of an aspect ratio of the hole, the bowing also occurs easily. If the bowing takes place, adjacent holes may be connected.

The present disclosure aims at providing a technique capable of improving a shape of the hole formed by the etching.

[Configuration of Plasma Etching Apparatus 1]

FIG. 1 is a schematic cross sectional view illustrating an example of a plasma etching apparatus 1 according to an exemplary embodiment. The plasma etching apparatus 1 in the present exemplary embodiment is, for example, a capacitively coupled parallel plate type plasma etching apparatus. The plasma etching apparatus 1 includes an apparatus main body 2 and a control device 3. The apparatus main body 2 is equipped with a processing vessel 10 which is made of, by way of non-limiting example, aluminum having an anodically oxidized surface and has a substantially cylindrical space formed therein. Alternatively, the processing vessel 10 may be made of pure aluminum or aluminum coated with thermally sprayed ceramic. The processing vessel 10 is grounded.

Within the processing vessel 10, a substantially cylindrical stage 11 is provided to place thereon a wafer W which is an example of a substrate on which a film as an etching target is formed. The stage 11 includes a lower electrode 12, an edge ring 13 and an electrostatic chuck 14. The lower electrode 12 is made of, by way of example, aluminum or the like, and is supported by a bottom of the processing vessel 10 with an insulating member 12a therebetween.

The electrostatic chuck 14 configured to attract and hold the wafer W by an electrostatic force is provided on a top surface of the lower electrode 12. The electrostatic chuck 14 has a structure in which an electrode 14a formed of a conductive film is embedded between a pair of insulating films 14b. The electrode 14a is electrically connected with a DC power supply 140. The wafer W is placed on a top surface of the electrostatic chuck 14, and is attracted to and held on the top surface of the electrostatic chuck 14 by the electrostatic force generated in a surface of the electrostatic chuck 14 by a DC voltage supplied from the DC power supply 140.

A conductive edge ring 13 made of, by way of non-limiting example, single crystalline silicon or the like is provided on the top surface of the lower electrode 12 to surround the electrostatic chuck 14. The edge ring 13 may also be referred to as a focus ring. The edge ring 13 is configured to improve uniformity of plasma processing on the surface of the wafer W. A side surface of the lower electrode 12 is surrounded by a cylindrical inner wall member 12b made of, by way of example, quartz or the like.

A second high frequency power supply 180 is connected to the lower electrode 12 via a switch 183 and a matching device 181. The second high frequency power supply 180 is a power supply for ion attraction (bias) and generates a second high frequency power having a frequency ranging from 300 kHz to 13.56 MHz, e.g., 2 MHz. The second high frequency power generated by the second high frequency power supply 180 is supplied to the lower electrode 12 via the matching device 181 and the switch 183 while the switch 183 is in an on state. The matching device 181 is configured to match an internal (or output) impedance of the second high frequency power supply 180 and a load impedance.

The control device 3 generates a pulse signal LF which is a periodic signal having a preset duty ratio, and supplies the generated pulse signal LF to the switch 183. The switch 183 controls a supply and a stop of the supply of the second high frequency power to the lower electrode 12 from the second high frequency power supply 180 based on the pulse signal LF supplied from the control device 3. The switch 183 is turned on when a voltage of the pulse signal LF is, for example, "High", so that the second high frequency power from the second high frequency power supply 180 is supplied to the lower electrode 12. Meanwhile, when the voltage of the pulse signal LF is "Low", the switch 183 is turned into an off state, so that the supply of the second high frequency power to the lower electrode 12 from the second high frequency power supply 180 is stopped.

A flow path 120 having, for example, an annular shape is formed within the lower electrode 12. A coolant is supplied into the flow path 120 from a non-illustrated chiller unit provided at an outside to be circulated therein via a pipeline 121a and 121b. As the lower electrode 12 is cooled by the coolant circulated within the flow path 120, the wafer W is also cooled through the electrostatic chuck 14 on the lower electrode 12.

Further, a heat transfer gas, for example, a He gas is supplied from a non-illustrated heat transfer gas supply device into a gap between the electrostatic chuck 14 and the wafer W placed thereon through a pipeline 141. A heat transfer rate between the electrostatic chuck 14 and the wafer W is adjusted by the heat transfer gas supplied through the pipeline 141. Accordingly, a temperature of the wafer W can be controlled to a preset temperature.

Around the stage 11, a gas exhaust path 71 is provided to surround the stage 11. A baffle plate 75 having a multiple number of through holes is provided in the gas exhaust path 71. Further, the gas exhaust path 71 is connected to a gas exhaust device 73 via a gas exhaust line 72. The gas exhaust device 73 has a vacuum pump such as, but not limited to, a turbo molecular pump and is capable of decompressing the inside of the processing vessel 10 to a required vacuum level.

An opening 74 is provided at a sidewall of the processing vessel 10, and this opening 74 is opened or closed by a gate valve G. Further, a deposition shield 76 and a deposition shield 77 are respectively provided on an inner sidewall of the processing vessel 10 and a sidewall of the stage 11 in a detachable manner. The deposition shields 76 and 77 are configured to suppress an etching byproduct (deposit) from adhering to the inner sidewall of the processing vessel 10 and the sidewall of the stage 11.

A shower head 16 is disposed above the stage 11, facing the lower electrode 12 of the stage 11. The shower head 16 serves as an upper electrode with respect to the lower electrode 12. The lower electrode 12 and the shower head 16 are disposed within the processing vessel 10 to be substantially parallel to each other. In the following, a space between the wafer W placed on the electrostatic chuck 14 and a bottom surface of the shower head 16 will be referred to as a processing space S.

The shower head 16 is supported at an upper portion of the processing vessel 10 with an insulating member 45 therebetween. The shower head 16 has a ceiling plate supporting member 160 and a ceiling plate 161. The ceiling plate supporting member 160 is made of, by way of non-limiting example, aluminum having an anodically oxidized surface and supports the ceiling plate 161 from above in a detachable manner. The ceiling plate 161 is made of a silicon-containing material such as, but not limited to, Si, SiC or quartz.

A diffusion space 162 is formed within the ceiling plate supporting member 160. Further, multiple through holes 163 are formed in a bottom portion of the ceiling plate supporting member 160 to communicate with the diffusion space 162. Furthermore, formed at an upper portion of the ceiling plate supporting member 160 is an inlet opening 165 through which a processing gas is introduced into the diffusion space 162. A gas supply 15 is connected to this inlet opening 165 via a pipeline 153.

The gas supply 15 includes a multiple number of gas sources 150a to 150c, a multiple number of mass flow controllers (MFC) 151a to 151c and a multiple number of valves 152a to 152c. The gas source 150a is a source of, for example, a $C_4F_6$ gas. The gas source 150b is a source of, for example, a $C_3F_8$ gas. The gas source 150c is a source of, for example, an $O_2$ gas.

The MFC 151a controls a flow rate of the $C_4F_6$ gas supplied from the gas source 150a and supplies the $C_4F_6$ gas having the controlled flow rate into the shower head 16 via the valve 152a and the pipeline 153. The MFC 151b controls a flow rate of the $C_3F_8$ gas supplied from the gas source 150b and supplies the $C_3F_8$ gas having the controlled flow rate into the shower head 16 via the valve 152b and the pipeline 153. The MFC 151c controls a flow rate of the $O_2$ gas supplied from the gas source 150c and supplies the $O_2$ gas having the controlled flow rate into the shower head 16 via the valve 152c and the pipeline 153.

In addition, the ceiling plate 161 is provided with multiple discharge holes 164 which are formed through the ceiling plate 161 in a thickness direction thereof. The discharge holes 164 communicate with the through holes 163 in one-to-one correspondence. The processing gas including the $C_4F_6$ gas, the $C_3F_8$ gas and the $O_2$ gas supplied into the diffusion space 162 through the inlet opening 165 is diffused within the diffusion space 162 to be supplied into the processing space S in a shower shape through the through holes 163 and the discharge holes 164.

The ceiling plate supporting member 160 is connected with a first high frequency power supply 170 via a switch 173 and a matching device 171. The first high frequency power supply 170 is a power source for plasma formation and configured to generate a first high frequency power having a frequency equal to or higher than 13.56 MHz, e.g., 60 MHz. The first high frequency power generated by the first high frequency power supply 170 is supplied to the ceiling plate supporting member 160 via the matching device 171 and the switch 173 while the switch 173 is in an on state. The matching device 171 is configured to match an internal (or output) impedance of the first high frequency power supply 170 and a load impedance.

The control device 3 generates a pulse signal HF which is a periodic signal having a preset duty ratio and supplies the generated pulse signal HF to the switch 173. The switch 173 controls a supply and a stop of the supply of the first high frequency power to the ceiling plate supporting member 160 from the first high frequency power supply 170 based on the pulse signal HF supplied from the control device 3. For example, the switch 173 is turned into the on state when a voltage of the pulse signal HF is "High", and supplies the first high frequency power from the first high frequency power supply 170 to the ceiling plate supporting member 160. Meanwhile, when the voltage of the pulse signal HF is "Low", the switch 173 is turned off, and the supply of the first high frequency power from the first high frequency power supply 170 to the ceiling plate supporting member 160 is stopped.

Furthermore, the ceiling plate supporting member 160 is connected with a DC power supply 174 via a low pass filter (LPF) 175. The DC power supply 174 supplies a negative DC voltage to the ceiling plate supporting member 160 via the LPF 175. The DC power supply 174 is an example of a voltage supply. Further, the shower head 16 is equipped with a temperature control device such as a non-illustrated heater and a non-illustrated pipeline for circulating a coolant. With this configuration, the shower head 16 can be regulated to a temperature within a required temperature range when the wafer W is processed.

The apparatus main body 2 having the above-described configuration is controlled by the control device 3 including a memory, a processor and an input/output interface. By reading out and executing programs stored in the memory, the processor controls the individual components of the apparatus main body 2 via the input/output interface based on recipes and data stored in the memory.

[Supply of the High Frequency Power Using Offset Pulse]

In the plasma etching apparatus 1 according to the present exemplary embodiment, the pulse signal HF and the pulse signal LF as shown in FIG. 2A and FIG. 2B, for example, are generated by the control device 3. FIG. 2A and FIG. 2B are diagrams illustrating examples of the pulse signals in the exemplary embodiment of the present disclosure. The pulse signal HF is used to supply the first high frequency power and to stop the supply of the first high frequency power, and the pulse signal LF is used to supply the second high frequency power and to stop the supply of the second high frequency power.

The pulse signal HF and the pulse signal LF are periodic pulse signals repeated at a cycle $T_0$. As depicted in FIG. 2A, for example, within the cycle $T_0$, the pulse signal HF is in a "High" state (hereinafter, referred to as "H state") in a period $T_H$ and is in a "Low" state (hereinafter, referred to as "L state") in the rest period of the cycle. The switch 173 is turned into an on state when the pulse signal HF is in the H state, thus allowing the first high frequency power to be supplied to the ceiling plate supporting member 160 from the first high frequency power supply 170. Meanwhile, the switch 173 is turned into an off state when the pulse signal HF is in the L state, thus stopping the supply of the first high frequency power to the ceiling plate supporting member 160 from the first high frequency power supply 170.

As shown in FIG. 2B, for example, within the cycle $T_0$, the pulse signal LF is in the H state in a period $T_L$ and is in the L state in the rest period of the cycle. The switch 183 is turned into an on state when the pulse signal LF is in the H state, thus allowing the second high frequency power to be supplied to the lower electrode 12 from the second high frequency power supply 180. Meanwhile, the switch 183 is turned into an off state when the pulse signal LF is in the L state, thus stopping the supply of the second high frequency power to the lower electrode 12 from the second high frequency power supply 180.

A length of the H state with respect to a length of the cycle $T_0$ is defined as a duty ratio. In the present exemplary embodiment, a duty ratio of the pulse signal HF is in a range from, e.g., 10% to 20%. Further, a duty ratio of the pulse signal LF is higher than the duty ratio of the pulse signal HF and is, for example, equal to or higher than 50%.

Further, in the present exemplary embodiment, a timing to when the pulse signal HF is turned into the H state from the L state and a timing $t_0$ when the pulse signal LF is turned into the L state from the H state are coincident. In addition, in the present exemplary embodiment, in a period when either one of the pulse signal HF and the pulse signal LF is in the H state within the cycle $T_0$, the other of the pulse signal HF and the pulse signal LF is in the L state. That is, within the cycle $T_0$, the pulse signal HF and the pulse signal LF are supplied exclusively. Accordingly, plasma can be stably formed within the processing vessel 10.

To ignite the plasma stably, the period $T_H$ of the pulse signal HF needs to be equal to or longer than 60μs. To set the period $T_H$ of the pulse signal HF to be equal to or longer than 60 μs at the duty ratio of 20%, a length of the single cycle $T_0$ of the pulse signal HF needs to be equal to or longer than 300 μs. Accordingly, a frequency of the pulse signal HF and the pulse signal LF needs to be equal to or less than 3.3 kHz.

Furthermore, if the period $T_L$ of the pulse signal HF is too long, the ignited plasma may extinguish. Thus, it is desirable that the frequency of the pulse signal HF is equal to or higher than, e.g., 1 kHz and the duty ratio of the pulse signal HF is equal to or larger than, e.g., 10%. Thus, it is desirable that the frequency of the pulse signal HF and the pulse signal LF is in a range from 1 kHz to 3.3 kHz.

In addition, in the present exemplary embodiment, it is desirable that the cycle $T_0$ includes a period $T_1$ during which both the pulse signal HF and the pulse signal LF are in the L state. Accordingly, hardware control is eased.

Further, in view of plasma stability, the duty ratios of the pulse signals HF and LF may satisfy a relationship shown in FIG. 3A and FIG. 3B, for example. FIG. 3A and FIG. 3B are diagrams illustrating another example of the pulse signals. In view of the plasma stability, the duty ratio of the pulse signal LF may be lower than the duty ratio of the pulse signal HF, as shown in FIG. 3A and FIG. 3B.

Furthermore, in view of the plasma stability, the duty ratios of the pulse signals HF and LF may satisfy a relationship shown in FIG. 4A and FIG. 4B, for example. FIG. 4A and FIG. 4B are diagrams illustrating yet another example of the pulse signals. In view of the plasma stability, the duty ratio of the pulse signal LF may be equal to the duty ratio of the pulse signal HF, as depicted in FIG. 4A and FIG. 4B.

With the pulse signals HF and LF shown in FIG. 3A and FIG. 3B and FIG. 4A and FIG. 4B, the plasma can be stably formed within the processing vessel 10. However, these pulse signals are not enough in the aspect of improvement of the hole shape as will be described later.

Further, in the pulse signal HF and the pulse signal LF as shown in FIG. 5A and FIG. 5B, for example, the plasma becomes instable within the processing vessel 10, which is not desirable. FIG. 5A and FIG. 5B are diagrams illustrating still yet another example of the pulse signals. In the pulse signal HF shown in FIG. 5A and the pulse signal LF shown in FIG. 5B, the timing when the pulse signal HF turns into the H state from the L state and the timing when the pulse signal LF turns into the L state from the H state are not coincident. As a result, the plasma becomes instable within the processing vessel 10.

Additionally, the pulse signal HF and the pulse signal LF shown in FIG. 6A and FIG. 6B are not desirable as the plasma becomes instable within the processing vessel 10. FIG. 6A and FIG. 6B are diagrams illustrating still yet another example of the pulse signals. In the pulse signal HF shown in FIG. 6A and the pulse signal LF shown in FIG. 6B, a timing $t_0$ when the pulse signal HF turns into the H state from the L state and a timing $t_0$ when the pulse signal LF turns into the L state from the H state are coincident. However, a period during which the pulse signal HF is in the H state and a period during which the pulse signal LF is in the H state are overlapped in a period $\Delta T$. As a result, the plasma becomes instable within the processing vessel 10.

[Plasma Etching Method]

Figure 7:
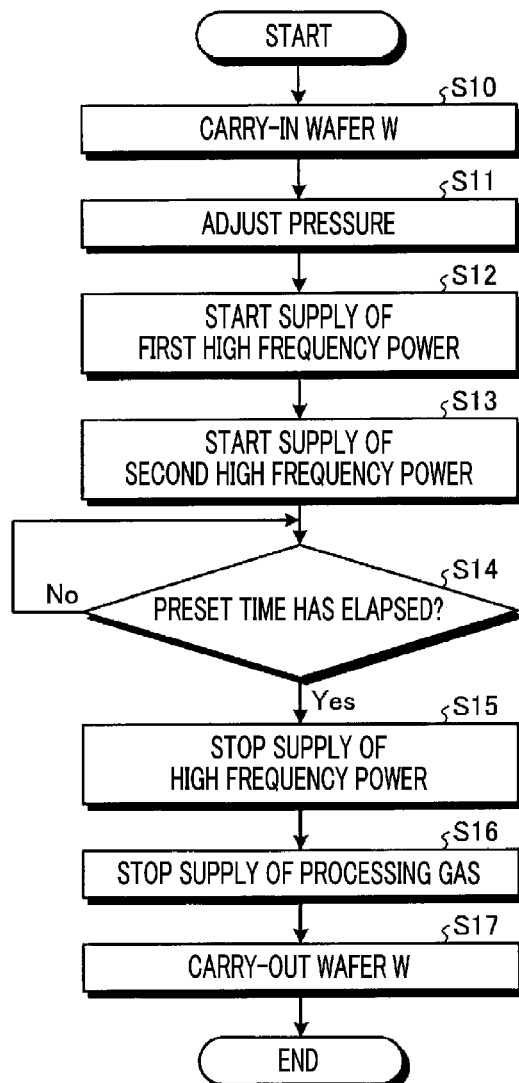
FIG. 7 is a flowchart illustrating an example of a plasma etching method according to the exemplary embodiment.

FIG. 7 is a flowchart illustrating an example of a plasma etching method according to the exemplary embodiment of the present disclosure. The plasma etching method shown in FIG. 7 is implemented as the control device 3 mainly controls the individual components of the apparatus main body 2.

First, a wafer W to be processed is carried into the processing vessel 10 (S10). In the process S10, the wafer W as illustrated in FIG. 8, for example, is carried into the processing vessel 10. FIG. 8 is a cross sectional view showing an example of the wafer W. The wafer W has a substrate 100, a silicon-containing film 101 and a mask film 102. The silicon-containing film 101 includes a silicon oxide film 103 and a silicon nitride film 104. The mask 102 is provided with a pattern according to a shape of openings of holes to be formed in the silicon-containing film 101.

In the process S10, the gate valve G is opened, and the wafer W to be processed is carried into the processing vessel 10 by a non-illustrated transfer device and placed on the electrostatic chuck 14. Then, the gate valve G is closed, and the DC voltage is supplied from the DC power supply 140 to the electrode 14a within the electrostatic chuck 14. Accordingly, the wafer W is attracted to and held on the top surface of the electrostatic chuck 14. Then, the temperature of the coolant circulated within the flow path 120 of the lower electrode 12 is adjusted by the non-illustrated chiller unit, so that the wafer W is controlled to a preset temperature. The process S10 is an example of a placing process.

Thereafter, an internal pressure of the processing vessel 10 is adjusted (S11). In the process S11, a gas within the processing vessel 10 is exhausted to a required vacuum level by the gas exhaust device 73, and the valves 152a to 152c are opened. Then, the flow rate of the $C_4F_6$ gas to be supplied into the processing vessel 10 from the gas source 150a is adjusted by the MFC 151a. Further, the flow rate of the $C_3F_8$ gas to be supplied into the processing vessel 10 from the gas source 150b is adjusted by the MFC 151b, and the flow rate of the $O_2$ gas to be supplied into the processing vessel 10 from the gas source 150c is adjusted by the MFC 151c. The processing gas including the $C_4F_6$ gas, the $C_3F_8$ gas and the $O_2$ gas is diffused within the diffusion space 162 of the shower head 16 and supplied into the processing space S of the processing vessel 10 in the shower shape. The process S11 is an example of a supplying process.

Subsequently, the supply of the first high frequency power into the processing vessel 10 via the shower head 16 is begun (process S12). In the process S12, the control device 3 generates the pulse signal HF as shown in FIG. 2A, for example, and the switch 173 controls the supply and the stop of the supply of the first high frequency power from the first high frequency power supply 170 to the shower head 16 based on the pulse signal HF. As the first high frequency power is supplied into the processing space S, the processing gas supplied into the processing space S is formed into plasma. The process S12 is an example of a plasma forming process.

Thereafter, the supply of the second high frequency power to the lower electrode 12 is begun (process S13). In the process S13, the control device 3 generates the pulse signal LF as shown in FIG. 2B, for example, and the switch 183 controls the supply and the stop of the supply of the second high frequency power from the second high frequency power supply 180 to the lower electrode 12 based on the pulse signal LF. As the second high frequency power is supplied to the lower electrode 12, ions included in the plasma formed in the processing space S are attracted into the wafer W on the electrostatic chuck 14. The wafer W is etched according to the pattern of the mask film 102 by the ions attracted into the wafer W. The process S13 is an example of an ion attracting process.

Then, it is determined whether a predetermined time has elapsed (S14). The predetermined time is, for example, a time required for forming the holes in the silicon-containing film 101 to reach a preset depth. If the predetermined time has not elapsed (S14: No), the processing of the process S14 is performed again.

Meanwhile, if the predetermined time has elapsed (S14: Yes), the supply of the first high frequency power and the supply of the second high frequency power are stopped (S15). Then, the valves 152a to 152c are closed, and the supply of the processing gas into the processing vessel 10 is stopped (S16).

Then, the processing gas within the processing vessel 10 is exhausted, and the supply of the DC voltage from the DC power supply 140 to the electrode 14a within the electrostatic chuck 14 is then stopped. Thereafter, the gate valve G is opened, and the processed wafer W is carried out from the processing vessel 10 by the non-illustrated transfer device (S17). Then, the plasma etching method shown in the present flowchart is ended.

Major processing conditions in the plasma etching method shown in FIG. 7 are as follows, for example.
Pressure: 10 mTorr to 30 mTorr
Gas kinds: $C_4F_6/C_3F_8/O_2$
First high frequency power: 2000 W to 3000 W
Second high frequency power: 7000 W to 10000 W
Cycle of pulse signal: 1 kHz to 10 kHz
Negative DC voltage supplied to shower head 16: −500 V to −300 V

[Comparative Experiments]

Experiments are conducted to compare the plasma etching of the present exemplary embodiment and a plasma etching of a comparative example. In the plasma etching according to the comparative example, pulse signals as illustrated in FIG. 9A and FIG. 9B, for example, are used. FIG. 9A and FIG. 9B are diagrams illustrating the pulse signals used in the comparative example.

Both a pulse signal HF and a pulse signal LF used in the comparative example are in the H state in a period $T_a$ within a cycle $T_0$, as shown in FIG. 9A and FIG. 9B, for example. Duty ratios ($T_a/T_0$) of the pulse signals HF and LF used in the comparative experiment are both 20%.

Meanwhile, the pulse signals HF and LF according to the present exemplary embodiment are the pulse signals as shown in FIG. 2A and FIG. 2B, for example. That is, within the cycle $T_0$, the timing $t_0$ when the pulse signal HF turns into the H state from the L state and the timing $T_0$ when the pulse signal LF turns into the L state from the H state are coincident. Further, the periods during which the pulse signal HF and the pulse signal LF are respectively in the H state are not overlapped. Furthermore, the duty ratio of the pulse signal LF is higher than the duty ratio of the pulse signal HF. In the experiment, the pulse signal HF having the duty ratio of 10% and the pulse signal LF having the duty ratio of 60% are used. The other processing conditions are same in the comparative example and the present exemplary embodiment.

Figures 10A, 10B:
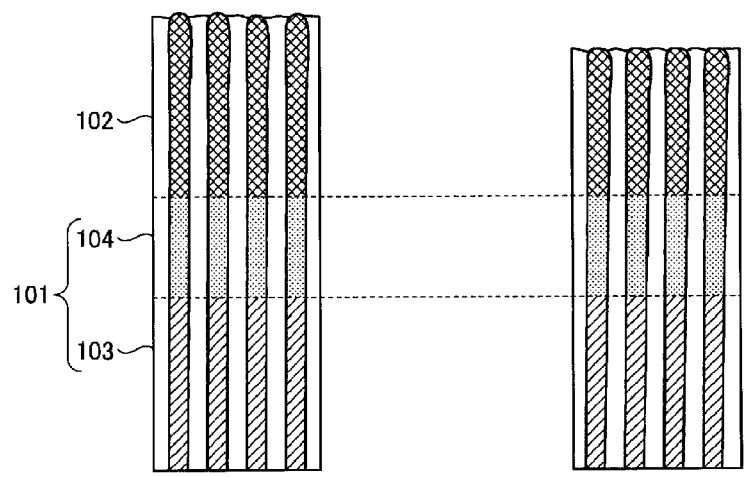
FIG. 10A and FIG. 10B are cross sectional views illustrating an example of shapes of holes formed in a first experiment.

FIG. 10A and FIG. 10B are cross sectional views illustrating an example of shapes of holes formed in a first experiment. FIG. 10A illustrates a hole formed in the wafer W under the processing conditions of the comparative example, and FIG. 10B illustrates a hole formed in the wafer W under the processing conditions of the present exemplary embodiment. In the following, a maximum value of a width of a hole in the silicon oxide film 103 will be referred to as a bowing value of the silicon oxide film 103, and a maximum value of a width of a hole in the silicon nitride film 104 will be referred to as a bowing value of the silicon nitride film 104.

In the hole formed under the processing conditions of the comparative example, the bowing value of the silicon oxide film 103 is 26.1 nm and the bowing value of the silicon nitride film 104 is 26.8 nm. Meanwhile, in the hole formed under the processing conditions of the present exemplary embodiment, the bowing value of the silicon oxide film 103 is 24.9 nm and the bowing value of the silicon nitride film 104 is 23.6 nm. That is, in the hole formed under the processing conditions of the present exemplary embodiment, the bowing value of the silicon oxide film 103 is improved by 1.2 nm and the bowing value of the silicon nitride film 104 is improved by 3.2 nm, as compared to the hole formed under the processing conditions of the comparative example.

Figures 11A, 11B, 11C:
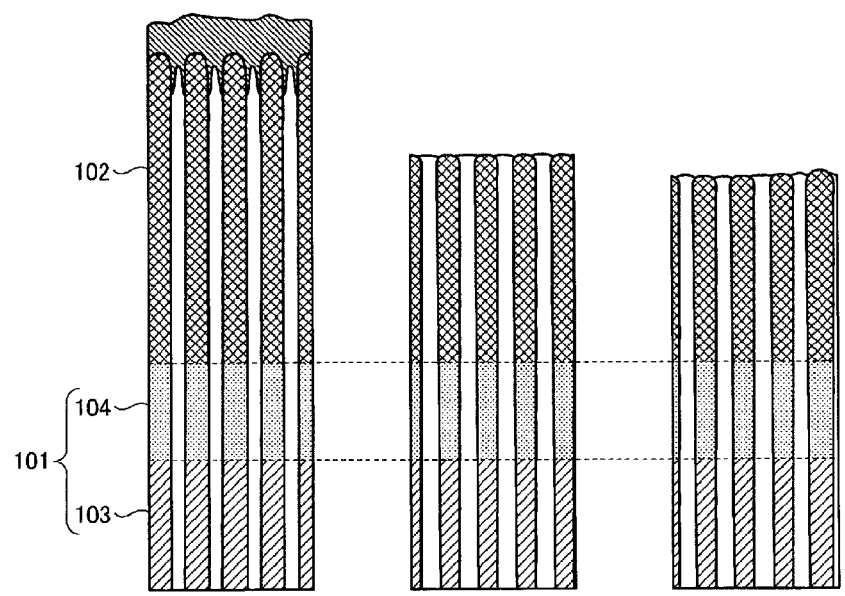
FIG. 11A to FIG. 11C are cross sectional views illustrating an example of shapes of holes formed in a second experiment.

FIG. 11A to FIG. 11C are cross sectional views illustrating an example of shapes of holes formed in a second experiment. In the second experiment, plasma etching is performed by using either one of the pulse signal HF and the pulse signal LF. FIG. 11A illustrates a shape of a hole formed by using only the pulse signal HF having the duty ratio of 10%; FIG. 11B, a shape of a hole formed by using only the pulse signal LF having the duty ratio of 60%; and FIG. 11C, a shape of a hole formed by using both the pulse signal HF and the pulse signal LF under the processing conditions of the present exemplary embodiment. In the plasma etching of FIG. 11A, the supply of the second high frequency power is stopped, and in the plasma etching of FIG. 11B, the supply of the first high frequency power is stopped. The other processing conditions are same.

When the plasma etching is performed by using only the pule signal HF having the duty ratio of 10%, an opening of the mask film 102 is closed by a reaction byproduct (so-called deposit), as illustrated in FIG. 11A, for example, and the etching is stopped. That is, by using the pulse signal HF having the duty ratio of 10%, the deposit can be deposited in the hole.

Further, when the plasma etching is performed by using only the pulse signal LF having the duty ratio of 60%, the hole is formed as illustrated in FIG. 11B, for example. In the hole shown in FIG. 11B, the bowing value of the silicon oxide film 103 is 22.1 nm, and the bowing value of the silicon nitride film 104 is 21.7 nm.

Furthermore, when the plasma etching is performed by using both the pulse signal HF having the duty ratio of 10% and the pulse signal LF having the duty ratio of 60%, the hole is formed as illustrated in FIG. 11C, for example. In the hole shown in FIG. 11C, the bowing value of the silicon oxide film 103 is 21.6 nm, and the bowing value of the silicon nitride film 104 is 20.3 nm. That is, in the hole formed under the processing conditions of the present exemplary embodiment, the bowing value of the silicon oxide film 103 is improved by 0.5 nm, and the bowing value of the silicon nitride film 104 is improved about 1.4 nm, as compared to the hole formed by using only the pulse signal LF having the duty ratio of 60%.

As clearly seen from the result of the second experiment shown in FIG. 11A to FIG. 11C, the etching of the hole is performed by the second high frequency power to which the pulse signal LF having the duty ratio of 60% is applied. In addition thereof, by supplying the first high frequency power to which the pulse signal HF having the duty ratio of 10% is applied, the etching can be performed while allowing the deposit to be deposited on the sidewall of the hole. Accordingly, in the hole formed under the processing conditions of the present exemplary embodiment, the bowing is suppressed.

Here, conditions for the formation of the deposit by the first high frequency power to which the pulse signal HF is applied are investigated. FIG. 12A to FIG. 12C are diagrams illustrating examples of etching rates when a magnitude of the first high frequency power is varied. FIG. 12A shows an etching rate when the first high frequency power is 500 W; FIG. 12B, an etching rate when the first high frequency power is 2000 W; and FIG. 12C, an etching rate when the first high frequency power is 5500 W. In FIG. 12A to FIG. 12C, a signal constantly maintained in the H state is input to the switch 173 instead of the pulse signal HF. Further, in FIG. 12A to FIG. 12C, a film as a measurement target of the etching rate is the silicon oxide film.

As can be clearly seen from FIG. 12A to FIG. 12C, the etching rate is found to decrease with a decrease of the first high frequency power. When the first high frequency power is 500 W, the etching rate is almost zero. Thus, if the first high frequency power is equal to or less than 500 W, it is found that the deposit is formed by the first high frequency power.

Figure 13C:
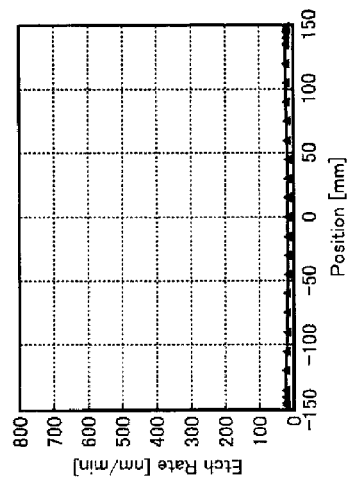
FIG. 13A to FIG. 13C are diagrams illustrating examples of an etching rate when a duty ratio of a pulse signal applied to the first high frequency power is varied.
Figure 13B:
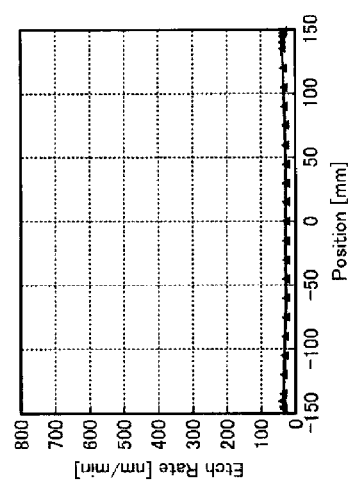
Figure 13A:
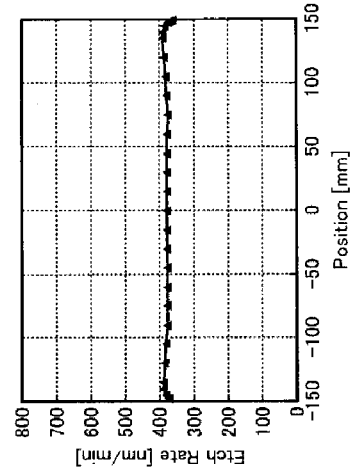

FIG. 13A to FIG. 13C are diagrams illustrating examples of the etching rate when the duty ratio of the pulse signal HF applied to the first high frequency power is varied. In FIG. 13A to FIG. 13C, the first high frequency power is 2000 W. FIG. 13A presents the same measurement result as that of FIG. 12B. In FIG. 13B, a pulse signal HF having a duty ratio of 20% is input to the switch 173. In FIG. 13C, a pulse signal HF having a duty ratio of 10% is input to the switch 173.

As clearly seen from FIG. 13A to FIG. 13C, the etching rate decreases with a decrease of the duty ratio of the pulse signal HF. In the pulse signal HF having the duty ratio of 20%, the etching rate is almost zero, as shown in FIG. 13B, for example. Thus, if the duty ratio of the pulse signal HF is equal to or less than 20% when the first high frequency power is 2000 W, it is found that the deposit is deposited by the first high frequency power.

As can be seen from the experiment results of FIG. 12A to FIG. 13C, when the first high frequency power is P (W) and the duty ratio of the pulse signal HF is D (%), it is deemed that the deposit is deposited by the first high frequency power if they satisfy a relationship represented by the following expression (1).

$$P \times D / 100 \leq 500 \quad (1)$$

Further, in view of forming stable plasma, it is desirable that the duty ratio of the pulse signal HF is equal to or larger than 10%. Thus, it is desirable that the duty ratio of the pulse signal HF is in a range from 10% to 20%.

Figure 14A:
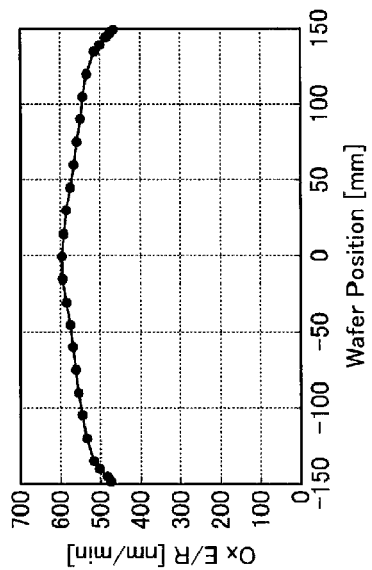
FIG. 14A and FIG. 14B are diagrams illustrating examples of an etching rate when a duty ratio of a pulse signal applied to a second high frequency power is varied.
Figure 14B:
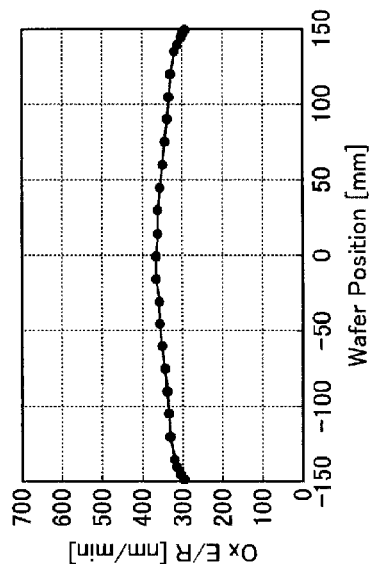

FIG. 14A and FIG. 14B are diagrams illustrating examples of the etching rate when the duty ratio of the pulse signal LF applied to the second high frequency power is varied. FIG. 14A shows an etching rate when a pulse signal HF having a duty ratio of 20% and a pulse signal LF having a duty ratio of 20% are used, and FIG. 14B shows an etching rate when the pulse signal HF having the duty ratio of 20% and a pulse signal LF having a duty ratio of 60% are used.

In FIG. 14A and FIG. 14B, a film as the measurement target of the etching rate is the silicon oxide film.

As clearly seen from the results of FIG. 14A and FIG. 14B, the etching rate increases with a rise of the duty ratio of the pulse signal LF. In the experiment of FIG. 14B, the duty ratio of the pulse signal LF is 60%. As a result of subsequent experiments, however, the etching rate is found to be improved if the duty ratio of the pulse signal LF is equal to or larger than 50%. Thus, it is desirable that the duty ratio of the pulse signal LF is equal to or larger than 50%.

So far, the exemplary embodiment has been described. As stated above, the plasma etching apparatus 1 according to the exemplary embodiment is equipped with the processing vessel 10, the stage 11, the gas supply 15, the first high frequency power supply 170, the second high frequency power supply 180 and the control device 3. The stage 11 is provided within the processing vessel 10, and the wafer W having the film as a target of etching formed thereon is placed on the stage 11. The gas supply 15 supplies the processing gas into the processing vessel 10. The first high frequency power supply 170 supplies the first high frequency power into the processing vessel 10, thus allowing the processing gas supplied into the processing vessel 10 to be excited into the plasma. The second high frequency power supply 180 supplies the second high frequency power having the frequency lower than the frequency of the first high frequency power to the stage. The control device 3 controls the supply and the stop of the supply of the first and second high frequency powers. Further, the control device 3 controls the supply and the stop of the supply of the first high frequency power and the supply and the stop of the supply of the second high frequency power at each preset cycle. Furthermore, the first high frequency power and the second high frequency power are supplied exclusively. In addition, a ratio of a supply time per the single cycle of the supply and the stop of the supply of the first high frequency power is lower than a ratio of a supply time per the single cycle of the supply and the stop of the supply of the second high frequency power. Accordingly, a shape of a hole formed in the wafer W by the etching can be improved.

Further, in the above-described exemplary embodiment, the single cycle in which the supply and the stop of the supply of the first and second high frequency powers are controlled includes a period in which neither the first high frequency power nor the second high frequency power is supplied. Accordingly, hardware control is eased.

Furthermore, in the above-described exemplary embodiment, the control device 3 starts the supply of the first high frequency power at a time when the supply of the second high frequency power is stopped. Accordingly, the plasma can be stably formed within the processing vessel 10.

Moreover, in the above-stated exemplary embodiment, the control device 3 controls the supply and the stop of the supply of the first high frequency power such that the ratio of the supply time per the single cycle of the supply and the stop of the supply of the first high frequency power is in the range from 10% to 20%. Accordingly, it is possible to allow etching in a depth direction of the hole to progress while suppressing etching of the sidewall of the hole.

Further, in the above-described exemplary embodiment, the control device 3 controls the supply and the stop of the supply of the second high frequency power such that the ratio of the supply time per the single cycle of the supply and the stop of the supply of the second high frequency power is equal to or larger than 50%. Accordingly, the hole having a required depth can be rapidly formed.

Furthermore, the plasma etching apparatus 1 according to the above-described exemplary embodiment is further equipped with the shower head 16 configured to supply the processing gas supplied from the gas supply 15 into the processing vessel 10 in the shower shape; and the DC power supply 174 configured to supply the negative DC voltage to the shower head 16. With this configuration, accuracy of the etching can be improved.

Moreover, in the above-described exemplary embodiment, the film as the target of the etching is a silicon-containing insulating film. The silicon-containing insulating film is a film including at least one of a silicon oxide film, a silicon nitride film and a silicon oxynitride film. Accordingly, the shape of the hole formed in the film as the target of the etching can be improved.

In addition, in the above-described exemplary embodiment, the plasma etching method includes the placing process, the supplying process, the plasma forming process and the ion attracting process. In the placing process, the wafer W having the film as the target of the etching formed thereon is placed on the stage 11 provided within the processing vessel 10. In the supplying process, the processing gas is supplied into the processing vessel 10. In the plasma forming process, the processing gas supplied into the processing vessel 10 is excited into the plasma as the first high frequency power is supplied into the processing vessel 10. In the ion attracting process, the ions include in the plasma of the processing gas are attracted into the wafer W as the second high frequency power having the frequency lower than the frequency of the first high frequency power is supplied to the stage 11. Accordingly, the shape of the hole formed in the wafer W by the etching can be improved.

[Others]

Here, it should be noted that the present disclosure is not limited to the above-described exemplary embodiment. Various changes and modifications may be made without departing from the scope of the present disclosure.

By way of example, in the above-described exemplary embodiment, the first high frequency power is supplied to the shower head 16. However, the exemplary embodiment is not limited thereto, and the first high frequency power may be supplied to the lower electrode 12.

Further, in the above-described exemplary embodiment, capacitively coupled plasma is used as a plasma source. However, the exemplary embodiment is not limited thereto. By way of non-limiting example, inductively coupled plasma (ICP), microwave-excited surface wave plasma (SWP), electron cyclotron resonance plasma (ECP) or helicon wave excited plasma (HWP) may be used as the plasma source.

According to the exemplary embodiment, it is possible to improve a shape of a hole formed by etching.

The exemplary embodiments stated above are not intended to be anyway limiting. The above-described exemplary embodiments may be omitted, substituted and modified in various ways without departing from the scope and the spirit of claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A plasma etching apparatus, comprising:
   a processing vessel;
   a stage provided within the processing vessel and configured to place thereon a substrate on which a film as an etching target is formed;
   a gas supply configured to supply a processing gas into the processing vessel;
   a first high frequency power supply configured to supply a first high frequency power into the processing vessel to form a processing gas supplied into the processing vessel into plasma;
   a second high frequency power supply configured to supply a second high frequency power having a frequency lower than a frequency of the first high frequency power to the stage; and
   a control device configured to control a supply and a stop of the supply of the first high frequency power and a supply and a stop of the supply of the second high frequency power,
   wherein the control device controls the supply and the stop of the supply of each of the first high frequency power and the second high frequency power at every preset cycle,
   the first high frequency power and the second high frequency power are supplied exclusively such that in a period when either one of the first and second high frequency power is supplied within a single cycle, the other of the first and second high frequency power is not supplied, and
   a ratio of a supply time with respect to the single cycle of the supply and the stop of the supply of the first high frequency power is lower than a ratio of a supply time with respect to the single cycle of the supply and the stop of the supply of the second high frequency power.

2. The plasma etching apparatus of claim 1, wherein the control device starts the supply of the first high frequency power at a time when the supply of the second high frequency power is stopped.

3. The plasma etching apparatus of claim 1, wherein the control device controls the supply and the stop of the supply of the first high frequency power such that the ratio of the supply time with respect to the single cycle of the supply and the stop of the supply of the first high frequency power is in a range from 10% to 20%.

4. The plasma etching apparatus of claim 1, wherein the control device controls the supply and the stop of the supply of the second high frequency power such that the ratio of the supply time with respect to the single cycle of the supply and the stop of the supply of the second high frequency power is equal to or larger than 50%.

5. The plasma etching apparatus of claim 1, further comprising:
   a shower head configured to supply the processing gas supplied from the gas supply into the processing vessel in a shower shape; and
   a voltage supply configured to supply a negative DC voltage to the shower head.

6. The plasma etching apparatus of claim 1, wherein the film as the etching target is a silicon-containing insulating film.

7. The plasma etching apparatus of claim 6, wherein the silicon-containing insulating film includes at least one of a silicon oxide film, a silicon nitride film and a silicon oxynitride film.

8. The plasma etching apparatus of claim 1, wherein the single cycle during which the supply and the stop of the supply of each of the first high frequency power and the second high frequency power is controlled includes a period during which neither the first high frequency power nor the second high frequency power is supplied.

9. The plasma etching apparatus of claim 8, wherein the control device starts the supply of the first high frequency power at a time when the supply of the second high frequency power is stopped.

10. The plasma etching apparatus of claim 9, wherein the control device controls the supply and the stop of the supply of the first high frequency power such that the ratio of the supply time with respect to the single cycle of the supply and the stop of the supply of the first high frequency power is in a range from 10% to 20%.

11. The plasma etching apparatus of claim 10, wherein the control device controls the supply and the stop of the supply of the second high frequency power such that the ratio of the supply time with respect to the single cycle of the supply and the stop of the supply of the second high frequency power is equal to or larger than 50%.

12. The plasma etching apparatus of claim 11, further comprising:
a shower head configured to supply the processing gas supplied from the gas supply into the processing vessel in a shower shape; and
a voltage supply configured to supply a negative DC voltage to the shower head.

13. The plasma etching apparatus of claim 12, wherein the film as the etching target is a silicon-containing insulating film.

14. A plasma etching method, comprising:
placing, on a stage provided within a processing vessel, a substrate on which a film as an etching target is formed;
supplying a processing gas into the processing vessel;
forming plasma from the processing gas supplied into the processing vessel by supplying a first high frequency power into the processing vessel; and
attracting ions included in the plasma formed from the processing gas into the substrate by supplying a second high frequency power having a frequency lower than a frequency of the first high frequency power to the stage,
wherein in the forming of the plasma and the attracting of the ions, a supply and a stop of the supply of the first high frequency power and a supply and a stop of the supply of the second high frequency power are controlled independently at every preset cycle,
the first high frequency power and the second high frequency power are supplied exclusively such that in a period when either one of the first and second high frequency power is supplied within a single cycle, the other of the first and second high frequency power is not supplied, and
a ratio of a supply time with respect to the single cycle of the supply and the stop of the supply of the first high frequency power is lower than a ratio of a supply time with respect to the single cycle of the supply and the stop of the supply of the second high frequency power.

* * * * *